United States Patent

Fratin et al.

[11] Patent Number: 5,920,776
[45] Date of Patent: Jul. 6, 1999

[54] METHOD OF MAKING ASYMMETRIC NONVOLATILE MEMORY CELL

[75] Inventors: Lorenzo Fratin, Buccinasco; Leonardo Ravazzi, Dalmine; Carlo Riva, Renate, all of Italy

[73] Assignee: SGS-Thomson Microelectronics, S.r.l., Agrate Brianza, Italy

[21] Appl. No.: 08/712,373

[22] Filed: Sep. 11, 1996

Related U.S. Application Data

[62] Division of application No. 08/503,303, Jul. 18, 1995, Pat. No. 5,712,814.

[30] Foreign Application Priority Data

Jul. 18, 1994 [EP] European Pat. Off. ............... 9483036

[51] Int. Cl.$^6$ ............................................. H01L 21/8247
[52] U.S. Cl. ........................... 438/257; 438/286; 438/302
[58] Field of Search ................................. 438/257–267, 438/286, 302, FOR 169, FOR 203; 257/316–324

[56] References Cited

U.S. PATENT DOCUMENTS

| 5,190,887 | 3/1993 | Tang et al. . |
| 5,316,961 | 5/1994 | Okazawa . |
| 5,471,419 | 11/1995 | Sankaranarayanan et al. ........ 365/182 |
| 5,518,942 | 5/1996 | Shrivastava . |
| 5,595,919 | 1/1997 | Pan . |
| 5,705,410 | 1/1998 | Guegan . |
| 5,783,457 | 7/1998 | Hsu . |
| 5,811,338 | 9/1998 | Kao et al. ............................... 438/286 |

FOREIGN PATENT DOCUMENTS

| 0 446 893 | 9/1991 | European Pat. Off. . |
| 0 514 602 | 11/1992 | European Pat. Off. . |
| 4-3983 | 1/1992 | Japan . |
| 4-211178 | 8/1992 | Japan . |
| 6-77499 | 3/1994 | Japan . |

OTHER PUBLICATIONS

Yoshikawa et al., "A 3.3V Operation Nonvolatile Memory Cell Technology," in *1992 Symposium on VLSI Technology Digest of Technical Papers*, Seattle, WA, Jun. 2–4, 1992, pp. 40–41.

Buti et al., "A New Asymmetrical Halo Source Gold Drain (HS–GOLD) Deep Sub–Half–Micrometer n–MOSPET Design for Reliability and Performance," in *Proceedings of IEEE Transactions on Electron Devices* 38(8):1757–1764, Aug., 1991.

Yoshikawa et al., "A Reliable Profiled Lightly–Doped Drain (PLD) Cell for High Density Submicron EPROMS and Flash EEPROMS," in *Extended Abstracts of the 20$^{th}$ Conference on Solid State Devices and Materials*, Tokyo, Japan, Aug. 24–26, 1988, pp. 165–168.

Hori, Takashi, A New Submicron p–Channel MOSFET with LATIPS ) Large–Tilt–Angle Implanted Punchtrough Stopper), *Journal of Electronic Engineering* 26(267):128–131, Mar., 1989.

Ohshima et al., "Process and Device Technologies of 16Mbit EPROMS with Large–Tilt–Angle Implanted P–Pocket Cell," in *Proceedings of the International Meeting of the Electron Devices Society*, San Francisco, CA, Dec. 9–12, 1990, pp. 5.2.1–5.2.4.

Susumu Koyama, "Super High Speed MOS Device," *The Super High Speed Digital Device Series, Part 2/Super High Speed MOS Devices*, pp. 44–45, Feb. 10, 1986.

*Primary Examiner*—Richard A. Booth
*Attorney, Agent, or Firm*—David V. Carlson; Seed and Berry LLP

[57] ABSTRACT

A nonvolatile memory having a cell comprising an N$^+$ type source region and drain region embedded in a P$^-$ type substrate and surrounded by respective P-pockets. The drain and source P-pockets are formed in two different high-angle boron implantation steps designed to optimize implantation energy and dosage for ensuring scalability of the cell and avoiding impairment of the snap-back voltage. The resulting cell also presents a higher breakdown voltage as compared with known cells.

16 Claims, 2 Drawing Sheets

METHOD OF MAKING ASYMMETRIC NONVOLATILE MEMORY CELL

This application is a division of U.S. patent application No. 08/503,303, filed Jul. 18, 1995 now U.S. Pat. No. 5,712,814.

TECHNICAL FIELD

The present invention relates to an EPROM and flash-EEPROM nonvolatile memory fabrication process, and relative nonvolatile memory.

BACKGROUND OF THE INVENTION

As is known, each cell of an EPROM (Electrically Programmable Read Only Memory) and flash-EEPROM (Electrically Erasable and Programmable Read Only Memory) nonvolatile memory presents a parasitic bipolar transistor, the emitter and collector regions of which are formed by the source and drain regions of the cell, and the base region of which is formed by the substrate (body) of the cell. When programming the cell, electrons and holes are formed at the drain-substrate junction, which holes travel through the substrate to produce a current (base current of the parasitic transistor) and directly bias the source-substrate junction. If the current is high enough, the potential barrier at the source-substrate junction is reduced to such an extent that the current through the source-substrate junction increases uncontrollably, resulting in rapid degradation of the gate or tunnel oxide of the cell.

For each fabrication process, a drain current to drain voltage curve can be drawn wherein degradation of the cell occurs over and above a predetermined ("snap-back") voltage, which therefore represents the maximum drain voltage that can be applied to the cell.

Without special processing, the built-in space charge (i.e., in the absence of biasing, with all the cell electrodes grounded) is particularly widespread and greatly reduces snap-back voltage (and hence the maximum voltage that can be applied to the cell).

To overcome this problem when fabricating nonvolatile memory cells of the type in question, boron is currently implanted over the entire surface of the cell by EPROM/EEPROM (EPM) implantation prior to forming the floating gate and control gate regions, so as to increase the relative snap-back voltage.

One suggestion made for scaling flash-EEPROM cells is to use a cell with a drain region ($N^+$ type) surrounded by a high-concentration ($\approx 10^{18}$ atoms/cm$^2$) P-pocket permitting a high degree of programming of cell. In this connection, see, for example, the article by Kuniyoshi Yoshikawa, Eiji Sagakami, Seiichi Mori, Norihisa Arai, Kazuhito Narita, Yoshiko Yamaguchi, Yoichi Ohshima and Kiyomi Naruke, "A 3.3 Operation Nonvolatile Memory Cell Technology", 1992 Symposium on VLSI Technology Digest of Technical Papers, IEEE.

According to the above proposal, the P-pocket or ring is formed by means of a special high-angle boron implantation step wherein the silicon wafer is tilted with respect to the implantation device. More specifically, the proposed fabrication process does away with preliminary (EPM) boron implantation, and comprises the following steps: after forming the stacked cell gates, the surface is masked to cover the regions in which the source regions are to be formed (drain implantation mask); an N-type doping agent such as arsenic is implanted to form the drain region; and, using the same mask, boron is high-angle implanted to form the P-pocket about the drain region. By virtue of the implantation angle and energy level, the P-pocket surrounds the drain region at the bottom and laterally towards the channel (thus extending beneath the stacked gates). At this point, the drain implantation mask is removed; a source implantation mask is formed to cover the drain regions and expose the substrate regions in which the source regions are to be formed; and source implantation is effected, normally by successively implanting arsenic and phosphorus.

In the above process, the fact that no boron is implanted at the source junction results, for a given heat treatment and given doses of phosphorus and arsenic, in a considerable increase in the breakdown voltage of the source junction, thus enabling a reduction in N-type ion implantation, which, with only a small reduction in the theoretically obtainable breakdown voltage, provides for reducing lateral diffusion of the N-type doping ions.

Moreover, the type of implantation employed provides for eliminating the follow-up heat treatment currently required for driving-in the doping agents. The combined reduction in ion implantation and heat treatment also results in a reduction in overlap between the drain region and gate regions, thus enabling scale reduction of the cell.

As stated, however, the absence of boron close to the source junction seriously impairs the snap-back voltage, so that the proposed solution of high-angle implanting a P-pocket at the drain junction greatly reduces the operating range of the cell and, as such, is of only very limited application.

SUMMARY OF THE INVENTION

It is an object of the present invention to provide a process for fabricating nonvolatile memory cells, designed to reduce the snap-back phenomenon while at the same time maintaining the scaling benefits typically associated with the high-angle P-pocket implantation technique.

In practice, according to one aspect of the present invention, the source region is also provided with a P-pocket surrounding the $N^+$ diffusion and formed in a high-angle implantation step other than that for forming the drain P-pocket. As such, the energy level and dose with which the two pockets are implanted may be optimized for ensuring scalability of the cells and avoiding impairment of the snap-back voltage, while at the same time permitting a certain increase in breakdown voltage as compared with present cells.

BRIEF DESCRIPTION OF THE DRAWINGS

A non-limiting embodiment of the present invention will be described by way of example with reference to the accompanying drawings, in which.

DETAILED DESCRIPTION OF THE INVENTION

The fabrication process according to the present invention comprises the same initial steps (up to and including fabrication of the floating and control gates) as in traditional processes, with the exception of the EPM implantation step which is eliminated as in the proposed high-angle P-pocket implantation process.

Figure 1:
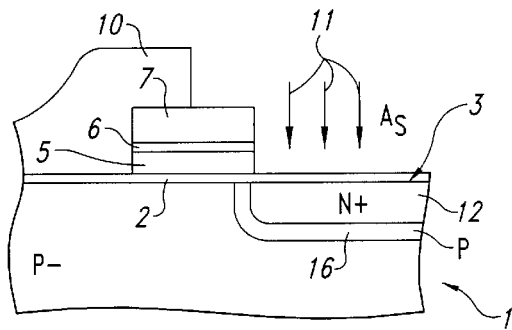
FIGS. 1 to 5 show various steps in the process according to the present invention.

Referring to FIG. 1, the process therefore commences as of an intermediate structure 1 comprising, for each cell, a tunnel oxide layer 2 covering surface 3 of a P⁻ type substrate 4; a polysilicon floating gate region 5; a dielectric layer (interpoly) 6; and a polysilicon control gate region 7 aligned with floating gate region 5.

Intermediate structure 1 is then masked with a resist (drain) mask 10 covering tunnel oxide layer 2 at the substrate portions in which the source regions are to be formed, as shown in FIG. 1. Arsenic ions are then implanted as shown schematically by arrows 11 to form an N⁺ type drain region 12.

Figure 2:
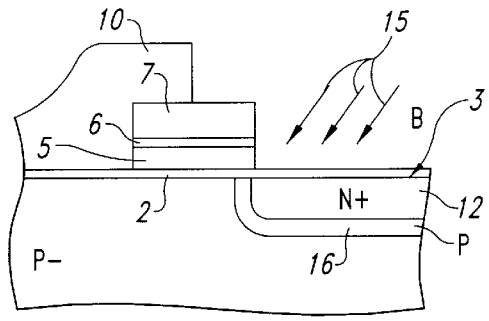

Referring to FIG. 2, at this point, using the same drain mask 10, boron ions are high-angle implanted in known manner, as shown by arrows 15 in FIG. 2, by tilting the wafer between 30° and 60°, in one embodiment 45°, in relation to the implantation device, and implantation is repeated, rotating the wafer each time by 90° about its axis of symmetry (twist rotation) in a known manner to take into account the various positions of the chips implementing the memories of each wafer. Implantation is optimized to ensure the formation of a pocket 16 (FIG. 2) of the required thickness about the N⁺ region, and in one aspect of the invention is performed with a total dose (comprising all four implantations at different twist angles) of $1\times10^{13}$ to $1\times10^{14}$ atoms/cm² and an energy level of 30 to 100 KeV.

Figure 3:
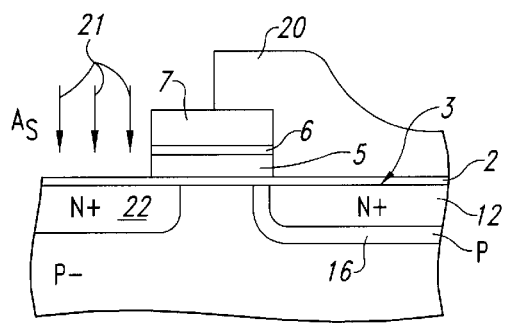

Referring to FIG. 3, drain mask 10 is then removed; a source mask 20 is deposited to cover drain regions 12 and any other regions not being implanted, and to expose the substrate regions in which the source regions are to be formed. Arsenic is implanted as shown by arrows 21 in FIG. 3 to form an N⁺ layer 22 using the same source mask 20 as in FIG. 3.

Figure 4:
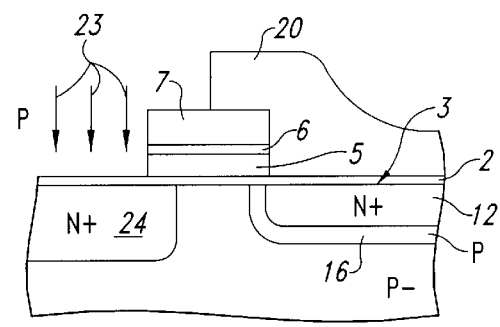

Referring to FIG. 4, phosphorus is implanted in a known manner as shown by arrows 23 to form N⁺ type source region 24 deeper than drain region 12.

Figure 5:
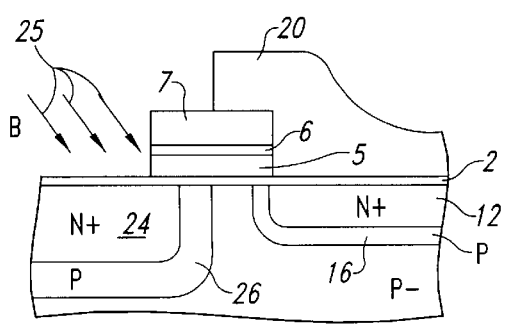

Referring to FIG. 5, without removing source mask 20, boron ions are then high-energy implanted, as shown by arrows 25 in FIG. 5, using a high-angle technique similar to that used for drain pocket 16, but with a different dose and energy level, which are optimized to withdraw the boron peak from the source junction to prevent overreducing its breakdown voltage, and to form a P-pocket 26 about source region 24.

More specifically, in one aspect of the invention, implantation is performed with a lower dose but a higher energy level as compared with that used to form drain P-pocket 16. As described above regarding drain P-pocket 16, source P-pocket 26 is also high-angle implanted at an angle of 30° to 60°, in one aspect of the invention 45°, and implantation is performed four times at different twist angles. In one aspect of the invention, source P-pocket 26 is implanted with a total dose (comprising all four implantations at different twist angles) of $5\times10^{11}$ to $5\times10^{12}$ atoms/cm² and an energy level of 80 to 130 KeV.

The formation of P-pocket 26 is then followed by removal of mask 20, with no heat treatment at this step, and by the usual steps for forming or completing any other devices in the same chip. Such steps may include forming an oxide layer covering and surrounding the gate regions (layer 30 in FIG. 6), forming a passivation layer, opening the contacts, forming the metal connecting lines, or forming a protective resin layer.

Figure 6:
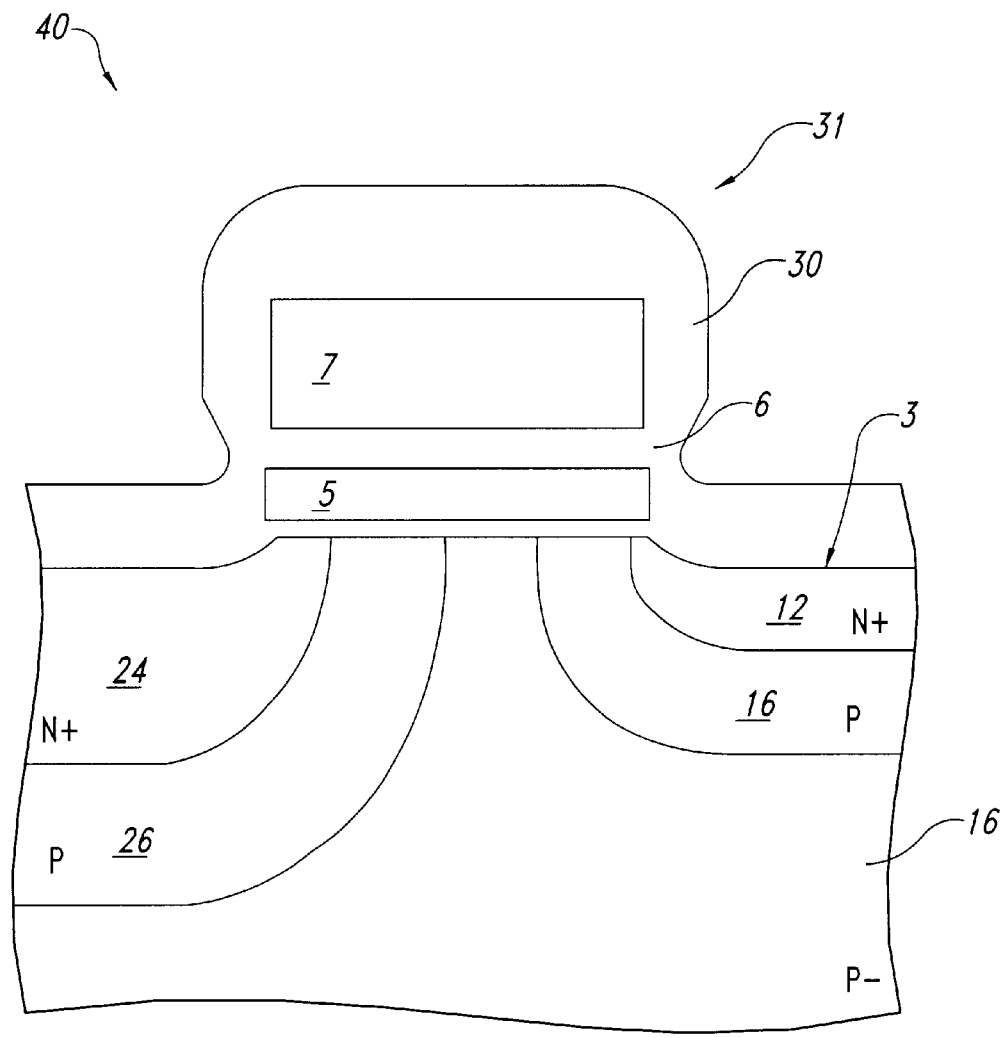
FIG. 6 shows a cross section of a memory cell formed by the FIG. 1 process.

Referring to FIG. 6, the structure of a resulting cell 31 that forms part of memory 40 is shown. For simplicity, the passivation and protective layers are omitted from cell 31, and the contours of the various layers are shown more realistically as compared with FIGS. 1 to 5. By virtue of the different implantation doses of pockets 16 and 26, the boron concentration of pocket 16 is greater than that of pocket 26 in one aspect of the invention.

Forming a P-pocket 26 about source region 24, by means of a special high-angle implantation step to optimize the energy level and dose, provides for greatly increasing snap-back voltage as compared with proposed devices featuring only a drain P-pocket and formed using the high-angle implantation technique. Though the increase in snap-back voltage may be achieved at the expense of a reduction in the breakdown voltage of the source junction, the process parameters may be so optimized that breakdown voltage is reduced by less than the increase achieved by eliminating EPM implantation over the entire surface of the cell. In particular, for cells which are erased by applying a high positive voltage to the source region and grounding the control gate region, breakdown voltage can be maintained higher than the erase voltage between the source and substrate, while at the same time fully exploiting the scaling and high-speed programming benefits typically associated with drain P-pocket structures.

Moreover, the process described involves no additional masking steps as compared with the known drain P-pocket cell fabrication process, because the additional step for high-angle implanting the source P-pocket is performed using the source implantation mask.

Clearly, changes may be made to the process and memory cell as described and illustrated herein without, however, departing from the scope of the present invention. In particular, the implantation parameters may differ from those described, bearing in mind that, in one aspect of the invention, the dose and energy level of the source P-pocket are respectively lower and higher than those of the drain P-pocket; the sequence in which the source and drain regions are implanted may vary, and be inverted as compared with that described (formation of the source region and pocket prior to forming the drain region and pocket); changes may be made to the phosphorus, arsenic and boron implantation sequence, or to the doping ions for forming the source and drain regions; and, finally, the same solution may also be applied to memories of an opposite conductivity type, i.e., having n-channel-type memory cells.

We claim:

1. A process for fabricating EPROM and flash-EEPROM nonvolatile memories comprising a memory cell having drain and source regions of a first conductivity type and embedded in a substrate of a second opposite conductivity type forming a channel region separating said drain and source regions; the process comprising the step of high-angle implanting a first doping agent of said second opposite conductivity type using first implantation parameters, to form a drain pocket of said second opposite conductivity type surrounding the drain region towards the channel region; characterized in that it comprises the step of high-angle implanting a second doping agent of said second opposite conductivity type using second implantation parameters differing from said first implantation parameters, to form a source pocket of said second opposite conductivity type surrounding said source region.

2. A process as claimed in claim 1, characterized in that it comprises the steps of masking said substrate by forming a drain mask presenting a drain opening at a first portion of said substrate; implanting a third doping agent of said first conductivity type through said drain opening to form said drain region; high-angle implanting said drain pocket through said drain opening; and removing said drain mask.

3. A process as claimed in claim 2, characterized in that it comprises the steps of masking said substrate by forming a source mask presenting a source opening at a second portion of said substrate; implanting a fourth doping agent of said first conductivity type through said source opening to form said source region; high-angle implanting said source pocket through said source opening; and removing said source mask.

4. A process as claimed in claim 3, characterized in that said first conductivity type is an N type, and said second opposite conductivity type is a P type.

5. A process as claimed in claim 4, characterized in that said first and second doping agents comprise boron; said third doping agent comprises arsenic; and said fourth doping agent comprises arsenic and phosphorus.

6. A process as claimed in claim 1, characterized in that said process parameters comprise implantation dose and implantation energy.

7. A process as claimed in claim 6, characterized in that the implantation dose in said step for high-angle implanting a first doping agent is greater than the implantation dose in said step for high-angle implanting a second doping agent; and the implantation energy in said step for high-angle implanting a first doping agent is lower than the implantation energy in said step for high-angle implanting a second doping agent.

8. A process as claimed in claim 7, characterized in that the total implantation dose in said step for high-angle implanting a first doping agent ranges between $1\times10^{13}$ and $1\times10^{14}$ atoms/cm$^2$; and the total implantation dose in said step for high-angle implanting a second doping agent ranges between $5\times10^{11}$ and $5\times10^{12}$ atoms/cm2.

9. A process as claimed in claim 7, characterized in that the implantation energy in said step for high-angle implanting a first doping agent ranges between 30 and 100 KeV; and the implantation energy in said step for high-angle implanting a second doping agent ranges between 80 and 130 KeV.

10. A process as claimed in claim 1, characterized in that said steps for high-angle implanting a first and second doping agent are performed at an angle ranging between 30° and 60°.

11. A method for forming a nonvolatile memory cell comprising:

forming in first and second regions respectively of a substrate of a second conductivity type a drain and a source of a first conductivity type;

implanting at a first angle a first impurity of said second conductivity type through said first region a to form a drain pocket around a portion of said drain; and implanting at a second angle a second impurity of said second conductivity type through said second region to form a source pocket around a portion of said source whereby the implantation conducted at the first angle has a different dose or implantation energy than the implantation conducted at the second angle.

12. The method of claim 11 wherein:

said forming comprises, forming a mask that covers said second region and exposes said first region, and implanting a third impurity of said first conductivity type into said first region to form said drain; and said implanting at a first angle comprises implanting said first impurity before removing said mask.

13. The method of claim 11 wherein:

said forming comprises, forming a mask that covers said first region and exposes said second region, and implanting a third impurity of said first conductivity type into said second region to form said source; and said implanting at a second angle comprises implanting said second impurity before removing said mask.

14. The method of claim 11 wherein said first and second impurities comprise boron.

15. The method of claim 11 wherein:

said implanting at a first angle comprises implanting said first impurity in a first dose and at a first energy level; and said implanting at a second angle comprises implanting said second impurity in a second dose smaller than said first dose and at a second energy level greater than said first energy level.

16. The method of claim 11 wherein said first and second angles range approximately between thirty and sixty degrees.

* * * * *

UNITED STATES PATENT AND TRADEMARK OFFICE
CERTIFICATE OF CORRECTION

PATENT NO. : 5,920,776
DATED      : July 6, 1999
INVENTOR(S) : Fratin, et. al.

It is certified that error appears in the above-identified patent and that said Letters Patent is hereby corrected as shown below:

Title page, item [30], Foreign Appliction Priority Data, delete "9483036" and insert therefor --94830363--.

Signed and Sealed this

Thirtieth Day of May, 2000

Attest:

Q. TODD DICKINSON

Attesting Officer

Director of Patents and Trademarks